US008035668B2

(12) United States Patent
Sugita et al.

(10) Patent No.: US 8,035,668 B2
(45) Date of Patent: Oct. 11, 2011

(54) EXPOSURE APPARATUS AND DEVICE MANUFACTURING METHOD

(75) Inventors: Mitsuro Sugita, Ohta-ku (JP); Kazuaki Ohmi, Yokohama (JP); Takao Yonehara, Kawasaki (JP); Toshihiko Tsuji, Utsunomiya (JP); Takaaki Terashi, Utsunomiya (JP); Tohru Kohda, Utsunomiya (JP); Shinji Tsutsui, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 839 days.

(21) Appl. No.: 11/336,754

(22) Filed: Jan. 19, 2006

(65) Prior Publication Data

US 2006/0158504 A1 Jul. 20, 2006

(30) Foreign Application Priority Data

Jan. 20, 2005 (JP) .................... 2005-013033

(51) Int. Cl.
*G03G 13/04* (2006.01)
(52) U.S. Cl. ..................... 347/130; 347/134
(58) Field of Classification Search .............. 347/119, 347/118
See application file for complete search history.

(56) References Cited

U.S. PATENT DOCUMENTS

| | | | |
|---|---|---|---|
| 6,121,944 A | 9/2000 | Havel | |
| 6,121,994 A * | 9/2000 | Kuribayashi et al. | 347/237 |
| 6,133,986 A * | 10/2000 | Johnson | 355/67 |
| 7,218,337 B2 * | 5/2007 | Yokoyama | 347/241 |
| 7,259,830 B2 * | 8/2007 | Ishii et al. | 355/67 |
| 2003/0082487 A1 * | 5/2003 | Burgess | 430/324 |
| 2003/0122091 A1 * | 7/2003 | Almogy | 250/492.24 |
| 2003/0214571 A1 * | 11/2003 | Ishikawa et al. | 347/255 |

FOREIGN PATENT DOCUMENTS

| | | |
|---|---|---|
| JP | 2004-274011 A | 9/2004 |
| JP | 2004-327660 A | 11/2004 |

OTHER PUBLICATIONS

Schubert, E.F., et al. "Highly Efficient Light-Emitting Diodes with Microcavities," Science, vol. 265, Aug. 12, 1994, pp. 943-945.
Japanese Office Action dated Jun. 18, 2010, which issued in counterpart Japanese patent application No. 2005-013033.

* cited by examiner

*Primary Examiner* — Stephen Meier
*Assistant Examiner* — Carlos A Martinez
(74) *Attorney, Agent, or Firm* — Fitzpatrick, Cella, Harper & Scinto

(57) ABSTRACT

An exposure apparatus which forms a pattern on an object. The apparatus includes an exposure head structure in which a plurality of elemental exposure units are arrayed, each elemental exposure unit including (i) at least one light source for emitting exposure light and (ii) an optical element which forms an image of the at least one light source on the object, for exposing the object. Positions of the images of the at least one light source in a direction perpendicular to a surface of the object include plural positions different from each other. A sensor detects a position of the surface of the object and produces a detection result. A controller receives the detection result and controls the exposure head structure such that a pattern is formed on the object by the exposure is selected to expose the object based on the detection result by the sensor.

14 Claims, 17 Drawing Sheets

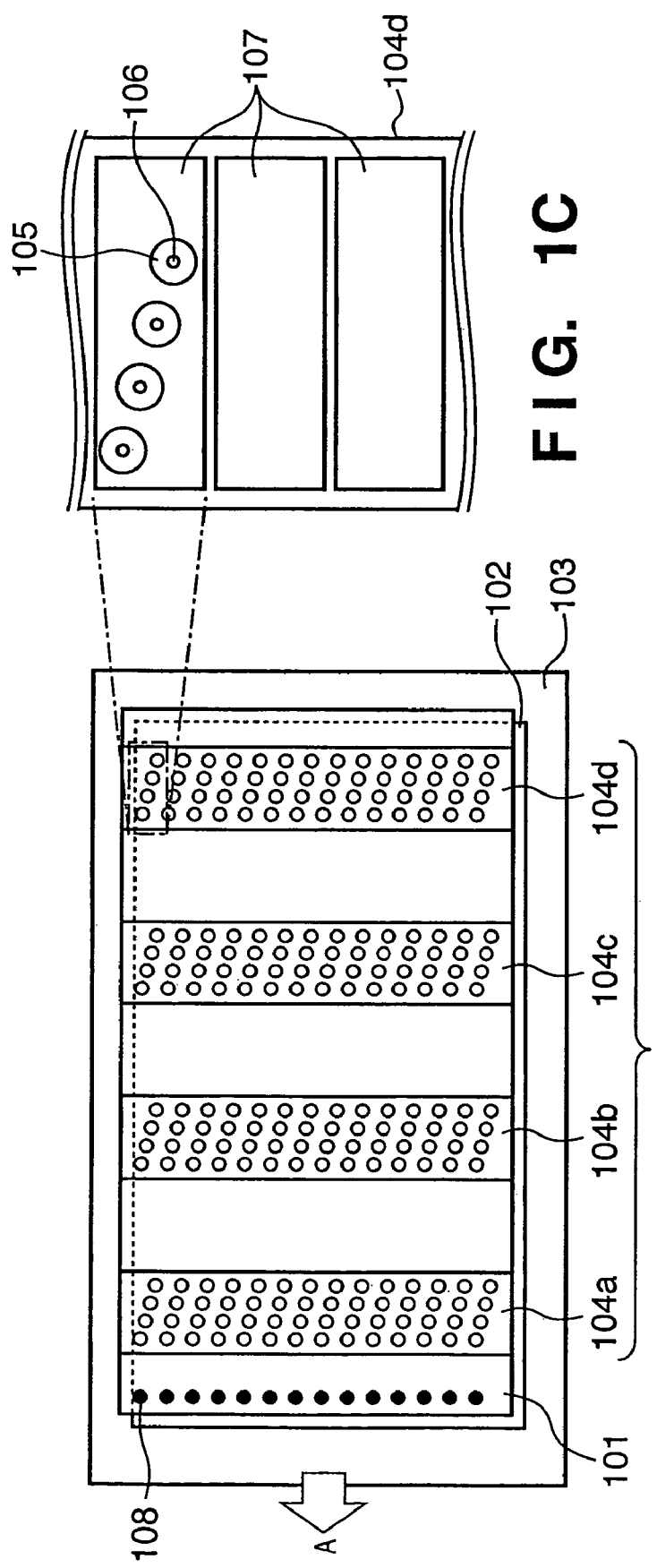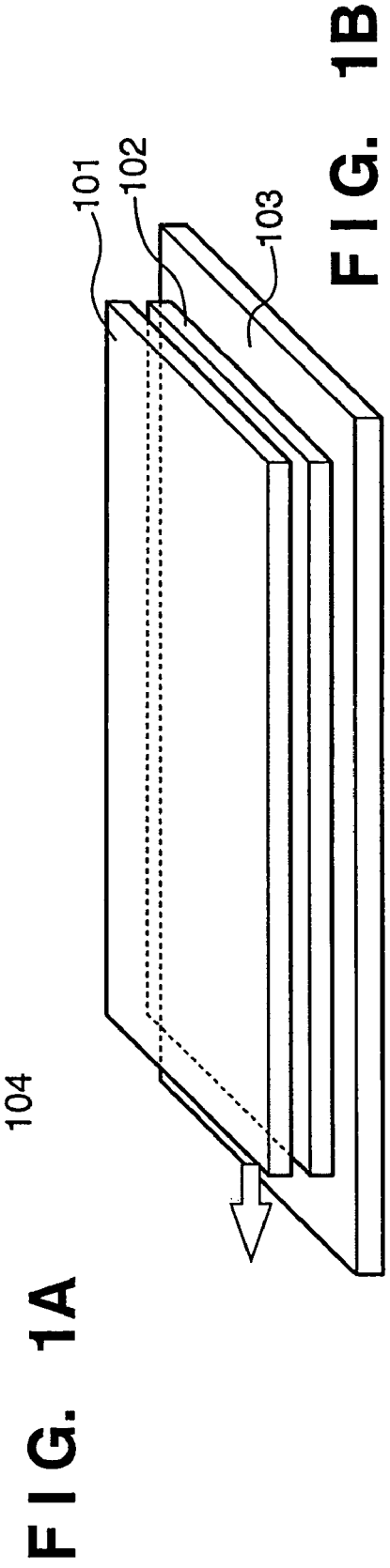

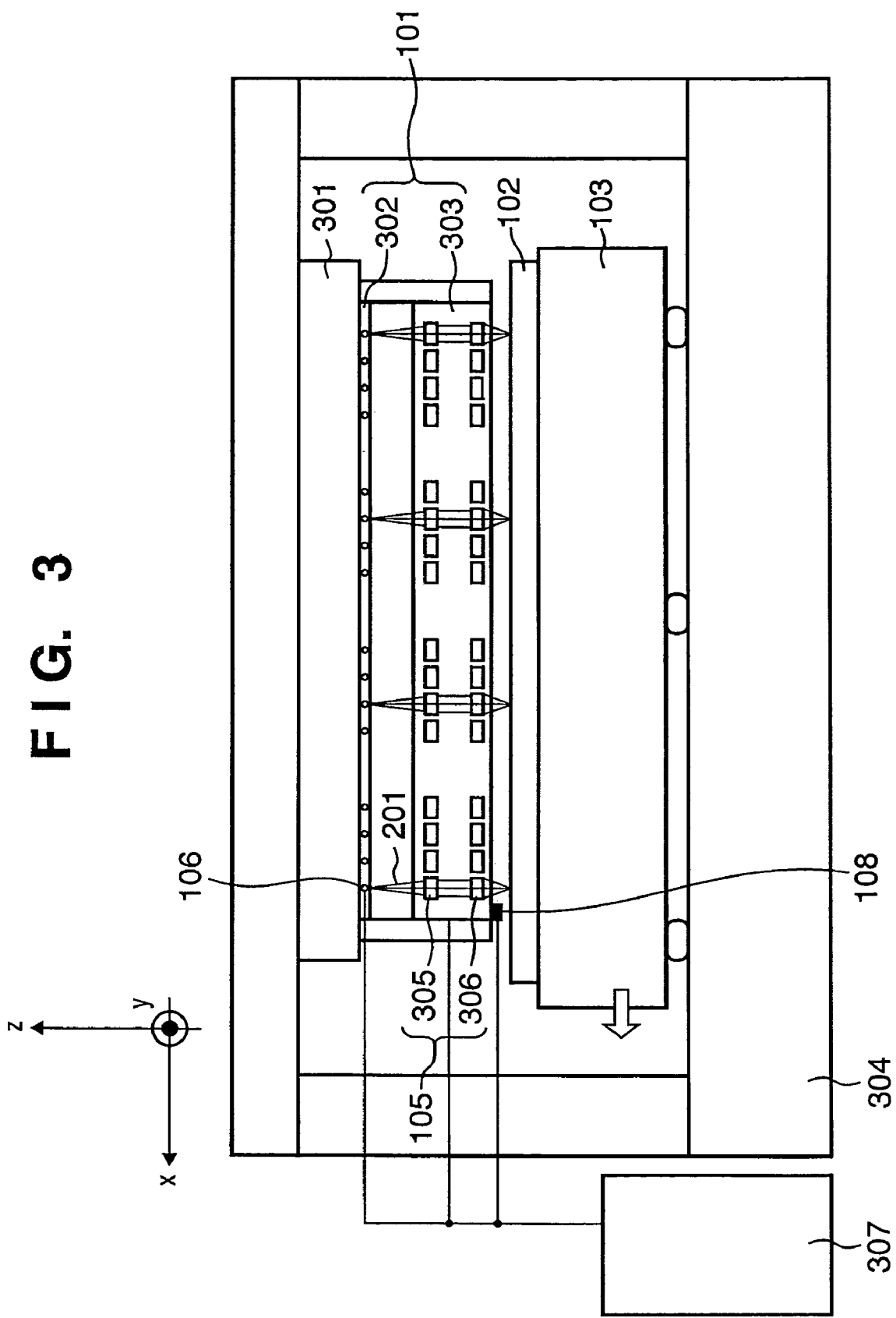

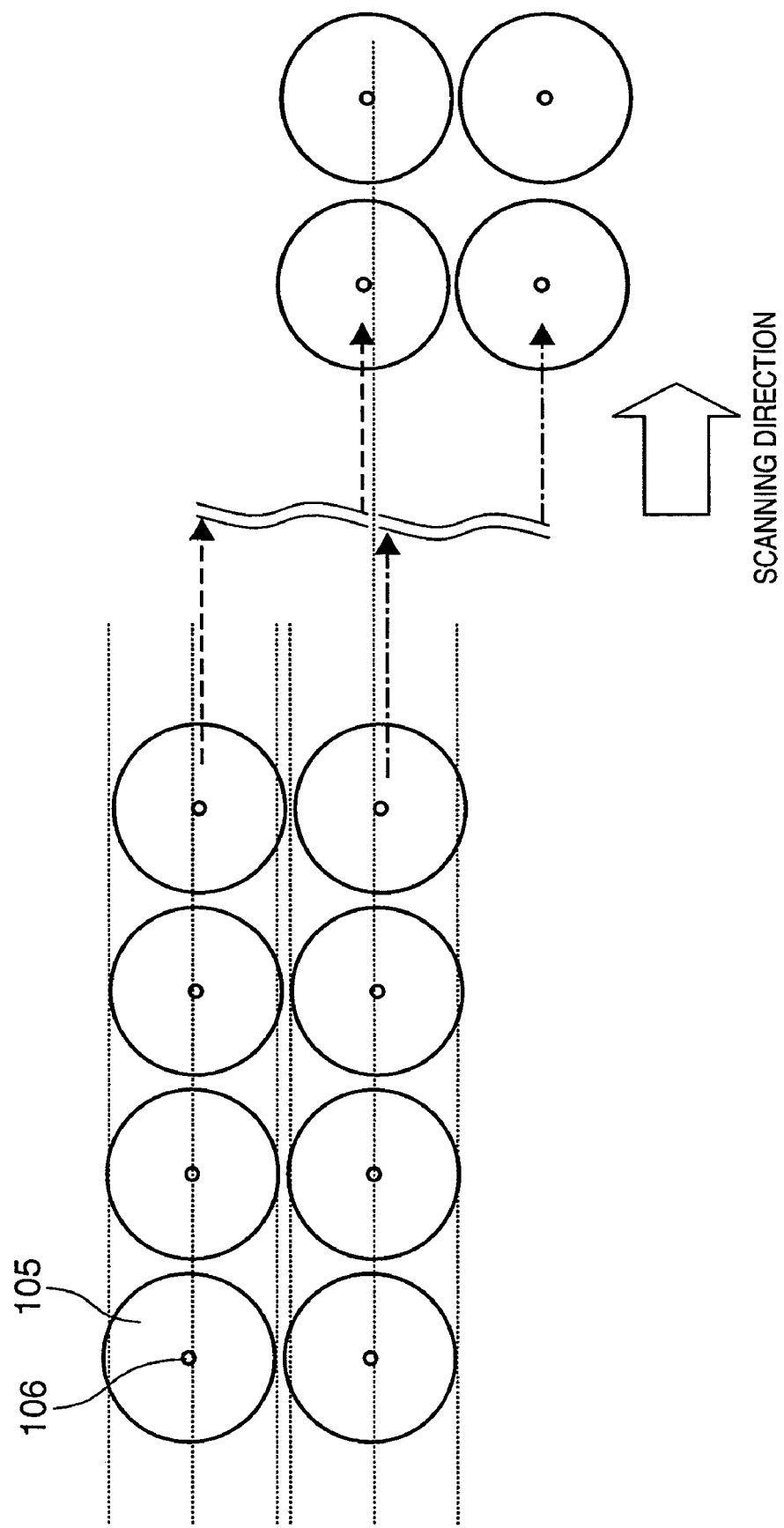

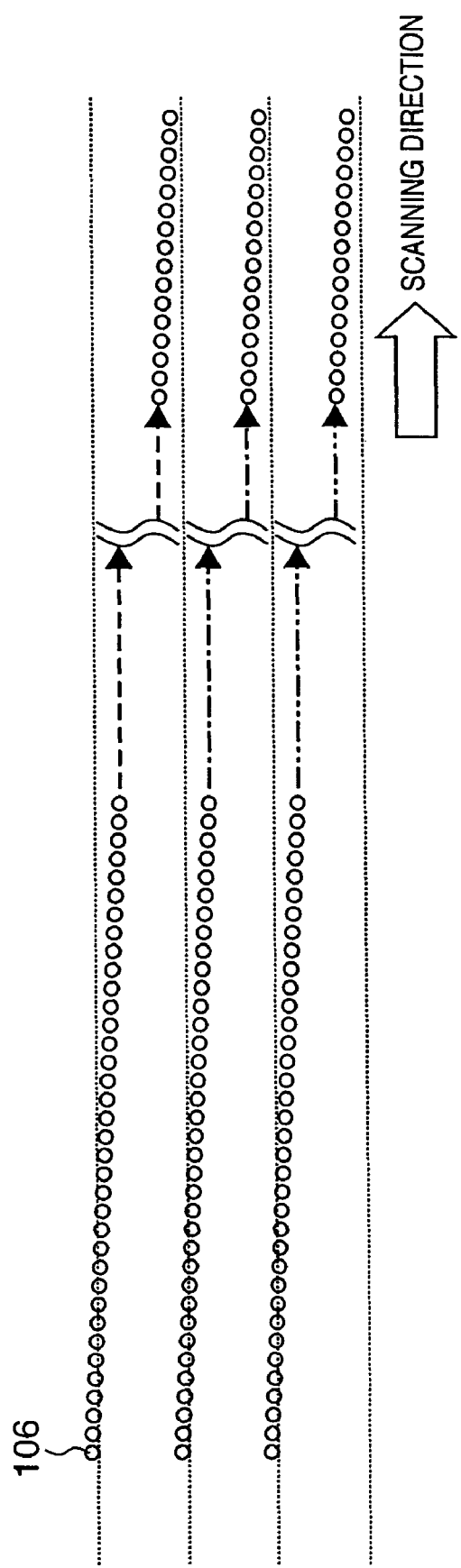
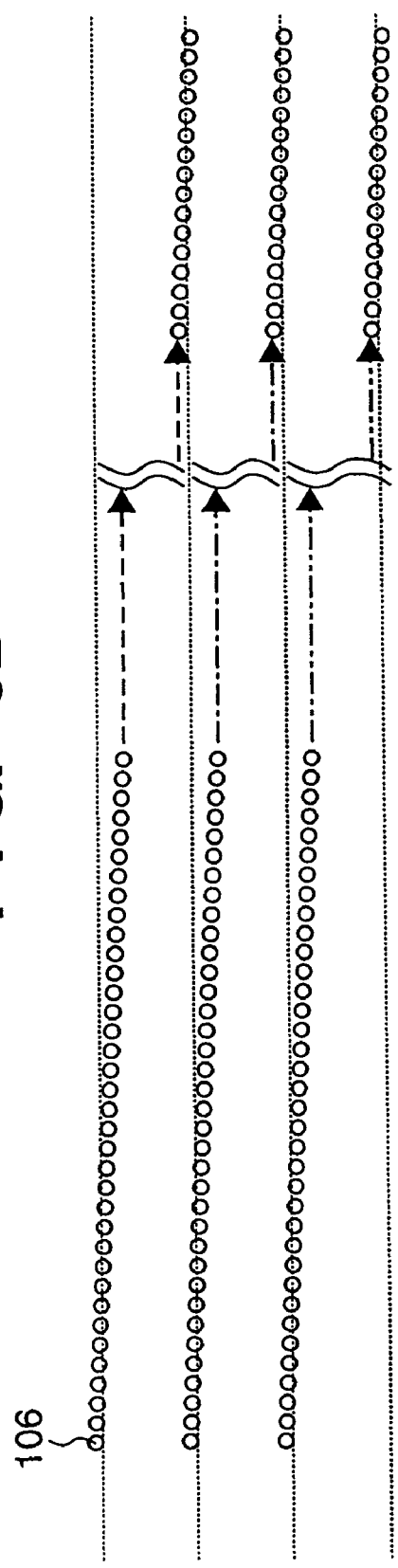

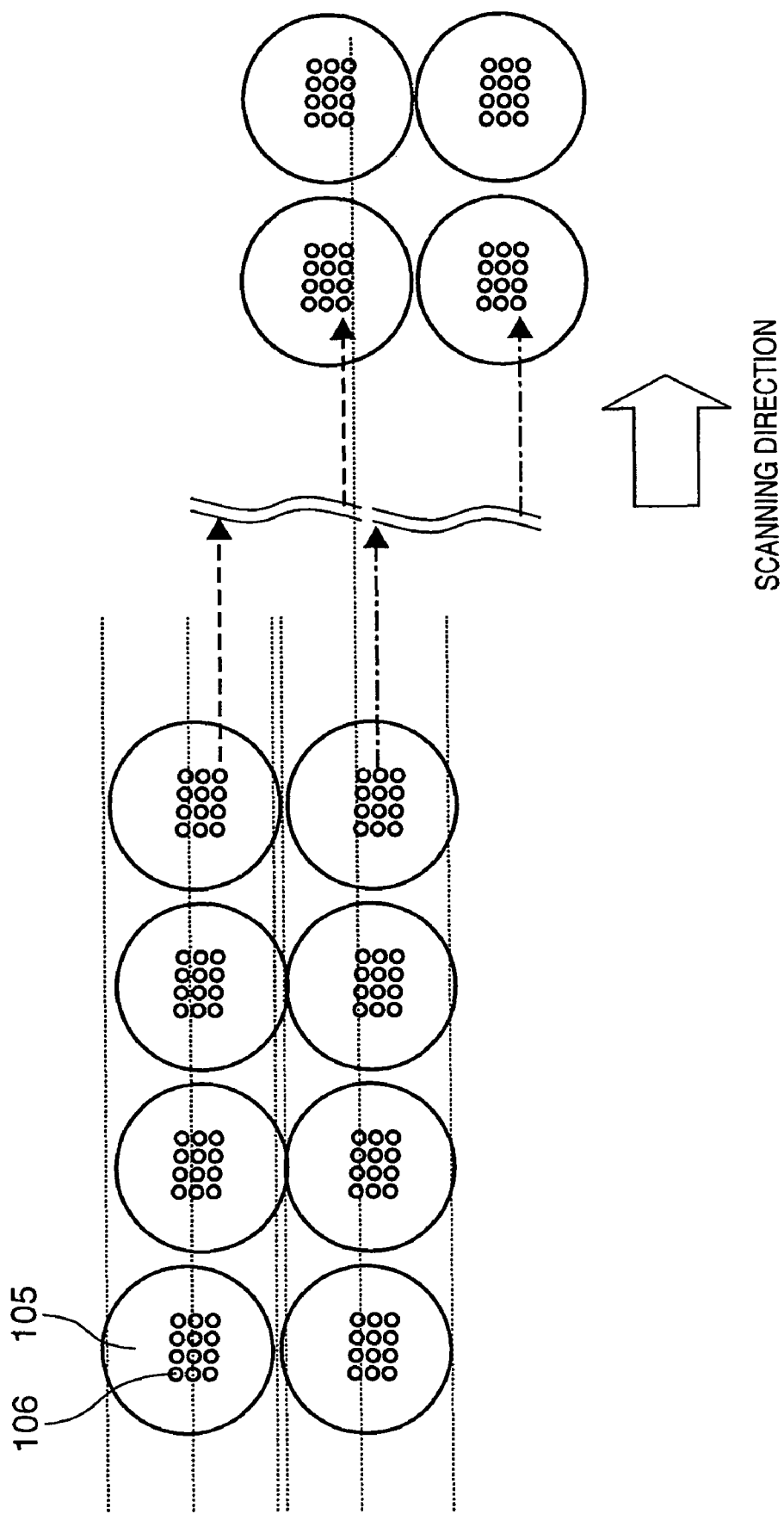

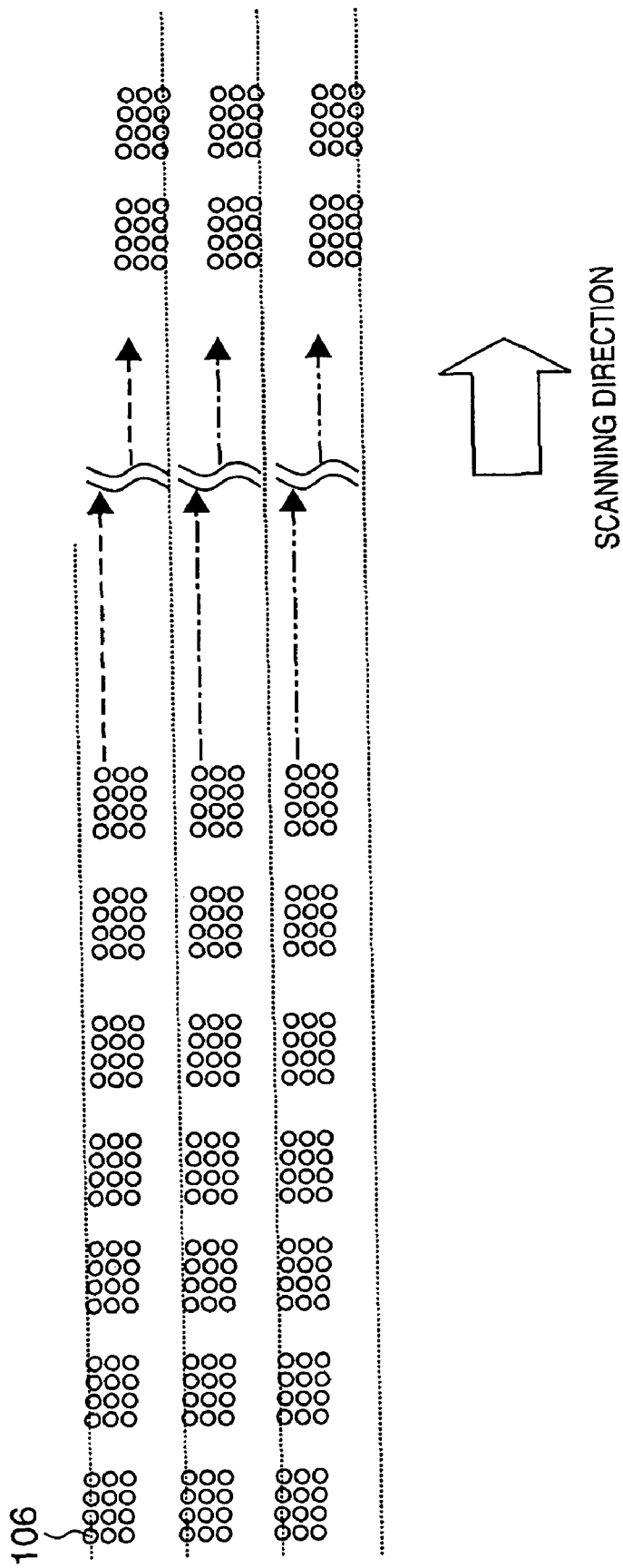

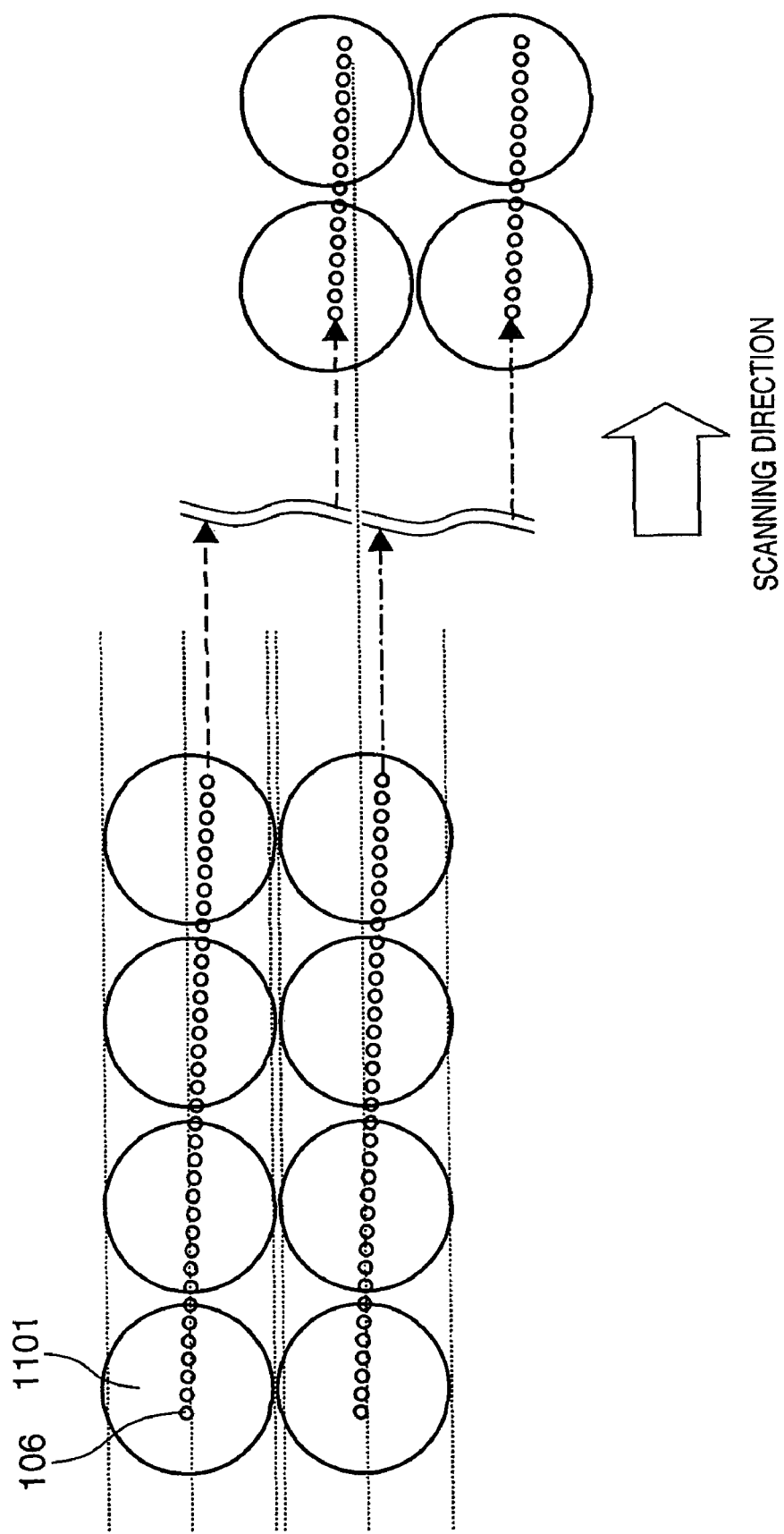

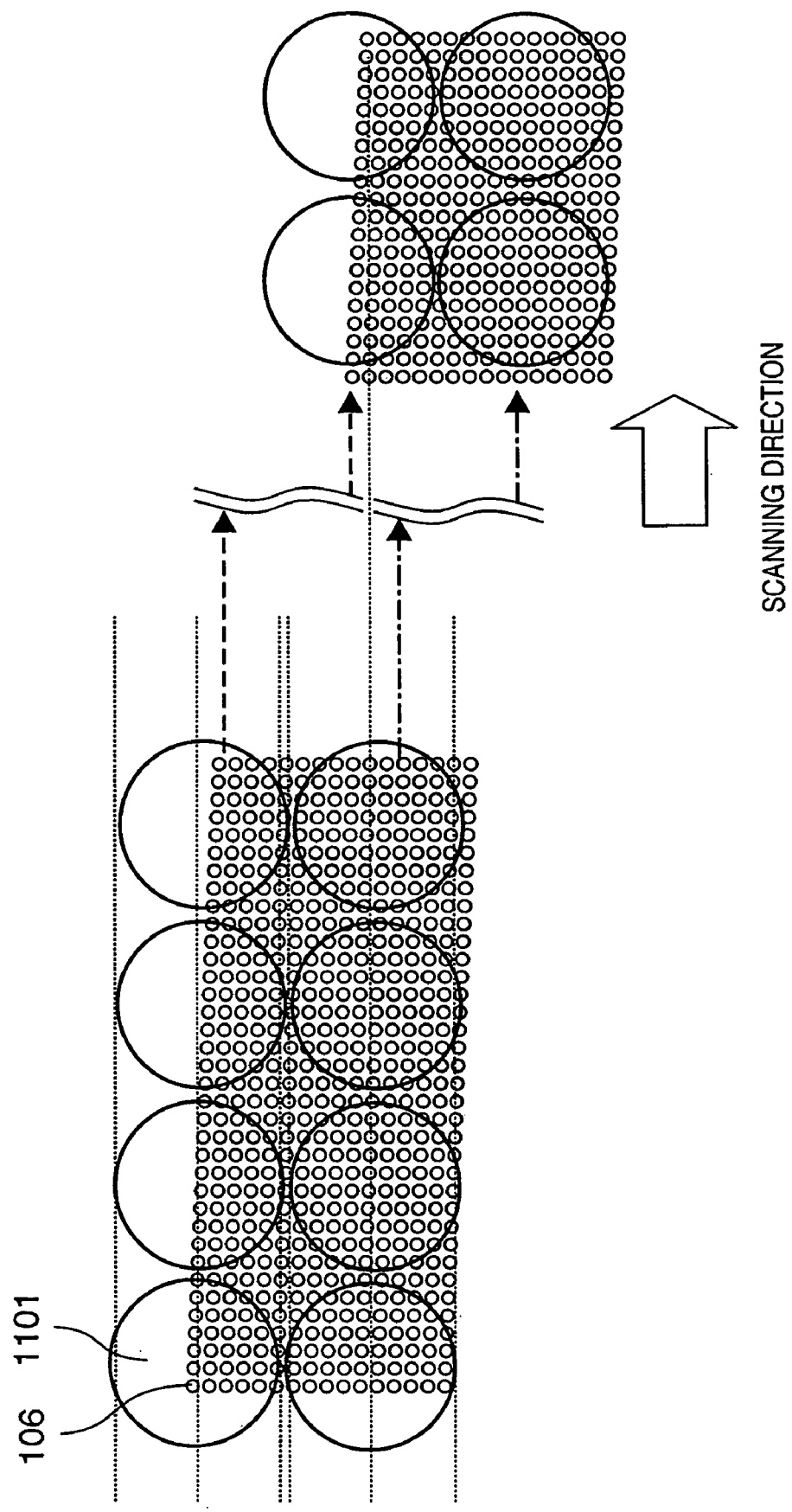

EXPOSURE APPARATUS AND DEVICE MANUFACTURING METHOD

This application claims the benefit of Japanese Application No. 2005-013033, filed on Jan. 20, 2005, which is hereby incorporated by reference herein in its entirety.

FIELD OF THE INVENTION

The present invention relates to an exposure apparatus and a device manufacturing method and, more particularly, to an exposure apparatus that forms a light source image on an object, and moves the object using a stage to form a pattern on the object, and a device manufacturing method using the exposure apparatus.

BACKGROUND OF THE INVENTION

Along with recent developments in IT (Information Technology) and the expansion of the mark, demands for a manufacturing apparatus that manufactures semiconductor devices, liquid-crystal display devices, and the like, have increased more and more. A particularly important component in manufacturing such devices is an exposure apparatus, which is used to form a pattern. Regarding the exposure apparatus, emphasis is put, not only on the exposure performance, but also, on the COO (Cost of Ownership), which supports the price competition of the finished products, i.e., the total operating cost of the manufacturing apparatus.

As an exposure apparatus, a one-to-one imaging exposure apparatus is generally used to illuminate a mask, to form a pattern within a predetermined region of the mask on a substrate within a good-image area in a projection imaging system. However, in the above one-to-one imaging exposure apparatus, the cost of a mask having a circuit pattern tends to greatly increase when the substrate size becomes larger. This is because one-to-one imaging basically requires a mask having the same size as that of a substrate. Accordingly, a reduction in cost of a mask is a serious problem in developing a large-sized display, such as a liquid crystal display.

Even in developing leading-edge VLSI submicron lithography, it is troublesome to reduce the cost of a mask, although its technical field is different from the liquid crystal display in line width, exposure area, and device specification. In the VLSI, the problem is not an increase in the size of a mask when the substrate size becomes larger, but an increase in the cost due to micropatterning. In particular, since the VLSI requires a large number of, e.g., twenty or more masks to be included in a mask set, mask costs present a serious problem.

To solve the above problem about the mask cost, a technique has been proposed that uses a mask lithography exposure apparatus (see, for example, U.S. Pat. No. 6,133,986).

U.S. Pat. No. 6,133,986 discloses a maskless lithography exposure apparatus that selectively reflects a portion of light using a DMD (Digital Micromirror Device) to expose the substrate surface.

When a glass substrate is used as an exposure target substrate, the working distance often varies due to undulations, typically having a size of about 20 μm, which are present on the surface of the glass substrate. If the working distance varies, a light source image is formed at a position that falls outside the surface of the exposure target substrate, resulting in a decrease in accuracy of the light source image formed on the surface of the exposure target substrate.

In U.S. Pat. No. 6,133,986, the working distance is detected using a light sensor. However, since image data obtained using the light sensor needs to be processed, the response speed naturally becomes low. Accordingly, a separate image data processing device is necessary. In addition, the optical path length needs to be assured. These requirements complicate the arrangement of the apparatus.

SUMMARY OF THE INVENTION

The present invention has been made in consideration of the above problems, and has as its object to provide an exposure apparatus and an exposure process capable of performing high-speed response with a simple arrangement.

According to a first aspect, the present invention provides an exposure apparatus that forms a pattern on an object. The exposure apparatus comprises an exposure head structure in which a plurality of elemental exposure units, each including at least one light source and an optical element, which forms an image of the light source on the object, are arrayed, a sensor which detects a surface position of the object, and a controller which controls exposure by the exposure head structure based on a detection result by the sensor, wherein the controller forms a pattern on the object while selectively operating one of the plurality of elemental exposure units, which satisfies a predetermined condition.

According to a second aspect, the present invention provides an exposure apparatus that forms a pattern on an object. The exposure apparatus comprises a light source array having a plurality of light sources, an optical element which forms an image of the light source on the object, a sensor which measures a surface position of the object using electromagnetic energy or dynamic energy, and a controller which controls a position of the image to be formed on the object via the optical element, based on a detection result by the sensor.

According to a third aspect, the present invention provides a device manufacturing method comprising steps of forming a pattern on a substrate using the above-described exposure apparatus, and developing the substrate having the pattern.

Other features and advantages of the present invention will be apparent from the following description, taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 1A to 1C are schematic views showing the overall arrangement of an exposure apparatus according to the first preferred embodiment of the present invention;

FIG. 3 is a schematic sectional view showing the exposure apparatus according to the first preferred embodiment of the present invention;

FIG. 4 is a schematic view for explaining scanning exposure, and the array arrangement of light sources and imaging optical systems of the exposure apparatus according to the first preferred embodiment of the present invention;

FIGS. 5A and 5B are schematic views for explaining scanning exposure, and the array arrangement of the light sources of the exposure apparatus according to the first preferred embodiment of the present invention;

FIG. 10 is a schematic view for explaining another example of scanning exposure, and the array arrangement of the light sources and imaging optical systems of the exposure apparatus according to the second preferred embodiment of the present invention;

FIG. 11 is a schematic view for explaining still another example of scanning exposure, and the array arrangement of the light sources of the exposure apparatus according to the second preferred embodiment of the present invention;

FIG. 12 is a schematic view for explaining scanning exposure, and the array arrangement of light sources and imaging optical systems of the exposure apparatus according to the third embodiment of the present invention;

FIG. 14 is a schematic view for explaining still another example of scanning exposure, and the array arrangement of the light sources of the exposure apparatus according to the third preferred embodiment of the present invention;

DETAILED DESCRIPTION OF THE PREFERRED EMBODIMENTS

First Embodiment

Figures 2A, 2B:
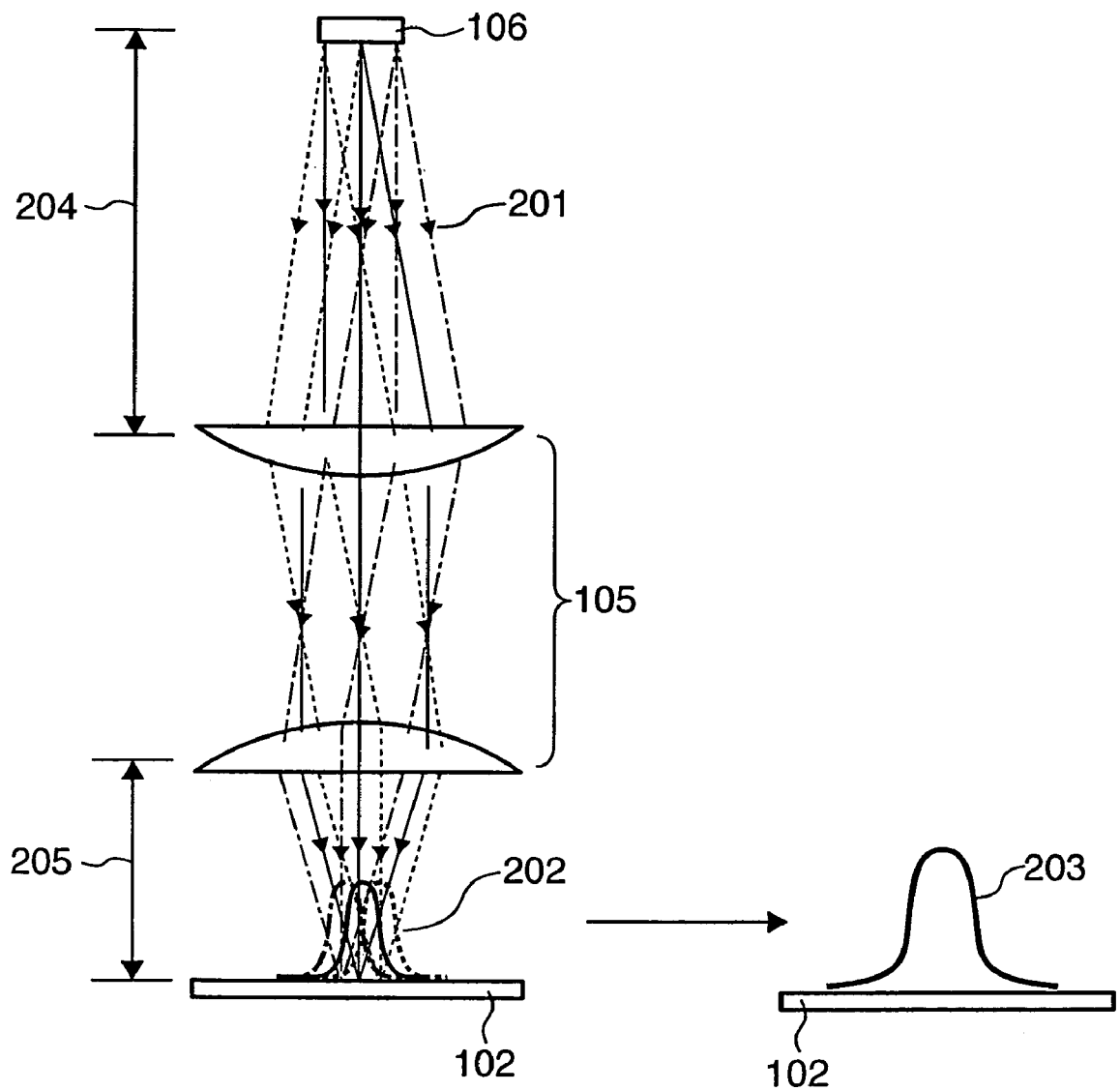
FIGS. 2A and 2B are schematic views showing an example of an imaging optical system of the exposure apparatus according to the first preferred embodiment of the present invention.

An exposure apparatus according to a preferred embodiment of the present invention will be explained below with reference to FIGS. 1A to 8. On an object such as a substrate, the exposure apparatus according to this embodiment forms light source images emitted based on ON/OFF information of each light source in a light source array, which is obtained by converting a circuit pattern designed by a software tool, such as a mask pattern CAD. More specifically, the exposure apparatus of this embodiment can be preferably used as a scanning type projection exposure apparatus for manufacturing devices, such as a semiconductor element. In particular, this apparatus can be adopted in manufacturing devices, e.g., a semiconductor device, such as an IC or an LSI, an image sensing device, such as a CCD, a display device, such as a liquid crystal panel, and a magnetic head.

FIGS. 1A to 1C are schematic views showing the overall arrangement of an exposure apparatus according to this embodiment. FIG. 1A is a plan view, FIG. 1B is a perspective view, and FIG. 1C is a partial enlarged view, each showing the exposure apparatus according to this embodiment. As shown in FIG. 1B, the exposure apparatus according to this embodiment can form images of a plurality of exposure light spots from an exposure head structure 101 onto an exposure target substrate 102 held on a substrate stage 103. The exposure apparatus according to this embodiment can form a circuit pattern by exposure by synchronizing scanning of the substrate stage 103 with ON/OFF of the exposure light spots. As shown in FIG. 1A, for example, the exposure head structure 101 comprises an exposure head array 104 including a plurality of exposure heads 104a to 104d. In FIG. 1A, although four exposure heads are arranged, one to three or five or more exposure heads may be arranged. Alternatively, the exposure heads may be arranged on the entire surface. With this arrangement, overlay exposure is allowed to cope with an increase in the size of the exposure target substrate 102 and a high throughput. As shown in FIG. 1C, each of the exposure heads 104a to 104d in the exposure head array 104 comprises elemental exposure units each including an optical system 150 and an LED light source 106. The LED light sources 106 are arranged such that the photosensitive body surface of the exposure target substrate 102 serves as an image surface. Elemental exposure units, each including the LED light source 106 and the optical system 105, corresponding to the LED light source 106, form respective images of the LED light sources 106 on the exposure target substrate 102. In this embodiment, the optical systems 105 are arranged obliquely with respect to the scanning direction (an arrow A in FIG. 1B), so as to form a pattern by exposure at a narrow pitch in a direction perpendicular to the scanning direction.

For example, the exposure apparatus according to this embodiment can be used to manufacture a TFT array for a large-sized liquid crystal display panel. In this case, a plurality of arrays of the LED light source 106 and optical system 105 are arranged in liquid crystal display pixels 107 (which schematically indicate three, R, G., and B pixels), so as to form, by exposure, a TFT circuit pattern, which controls each pixel 107. Since the TFT circuit for a liquid crystal display repeatedly transfers data for each pixel, there is no need to transfer individual pattern data, i.e., ON/OFF control signals of LED light sources to all pixels in a large-sized substrate. The same data can be transmitted to each pixel, to control ON/OFF of the LED light sources. In this embodiment, for example, the size of the exposure target substrate as the large-sized substrate is about 700 mm×900 mm (so-called, a 46-inch-panel size), the pixel size of the liquid crystal display is 200 μm×600 μm, and the minimum line width of the TFT circuit pattern is 3 μm. However, the present invention is not limited to these sizes.

FIG. 2A is a schematic view showing the arrangement of the LED light source, optical system, and exposure target substrate according to this embodiment. A light source image of the LED light source 106 is reduced and formed on the exposure target substrate 102 by the reduction optical system 105. The reduction optical system 105 is designed to have an image-side numerical aperture NA larger than the object-side numerical aperture NA, as indicated by beams 201 and 202. With this arrangement, a light-source-side working distance 204 is inevitably larger than an exposure-target-surface-side working distance 205.

Regarding the resolution of the light source image, different light-emitting portions within the light-emitting area of the LED light source 106 do not interfere with each other, as indicated by the beam 202, so incoherent images are formed. The points of the light-emitting portions form extended point images, respectively, depending on the performance of the reduction optical system 105. The resultant point images are shifted and adjusted to positions which are determined depending on the size of the LED light source 106 and the magnification of the reduction optical system 105. The sum of the intensities of the point images forms an entire light source image 203 (see FIG. 2B). The performance of the reduction optical system 105 described above includes a diffraction limit and an aberration performance, which are determined depending on the image-side numerical aperture NA of the reduction optical system 105 and the arrangement of a condensing element.

FIG. 3 is a sectional view showing an exposure portion of the exposure apparatus according to this embodiment. An exposure head board 301 is fixed and held from a main body pedestal 304. An LED array 302 and an electrical control system (not shown) for turning on/off an LED light source are arranged under the exposure head board 301. The electrical control system is connected to a circuit pattern-to-ON/OFF signal converter (not shown) via a data transfer line. An optical element array board 303 is arranged below the LED light source array 302, while being spaced apart therefrom by a distance of about the light-source-side working distance of the optical system. Groups of optical elements 305 and 306 are arranged in an array on the optical element array board 303. The exposure target substrate 102 is held on the substrate stage 103, while being spaced apart from the optical elements 305 and 306 by a predetermined exposure-target-substrate side working distance. The substrate stage 103 moves on the pedestal 304 while being scanned. A laser interferometer or encoder (not shown) feedback-controls the position of the substrate stage 103 during scanning movement.

FIG. 4 is a view for explaining scanning exposure according to this embodiment. FIG. 4 is a schematic view showing the LED light source 106 when viewed from the top. FIG. 4 shows a state in which the plurality of LED light sources 106 and optical systems 105 are arranged in an array. In this embodiment, an elemental exposure unit is formed by combining the LED light source 106 with the optical system 105 in a one-to-one correspondence. That is, one elemental exposure unit forms an image of one LED light source on an exposure target substrate (not shown). These combinations are arranged in a two-dimensional array. More specifically, as shown in FIG. 4, the LED light sources 106 in a row are arranged obliquely from the left side to the right side in FIG. 4 (in the scanning direction). The height (position in a direction perpendicular to the scanning direction) of the rightmost LED light source 106 in the first row is almost the same as that of the leftmost light source 106 in the second row. The elemental exposure units are continuously arranged so as not to form a space as trouble in scanning.

FIG. 5A emphasizes the continuity of the light source images of the LED light sources 106. The LED light sources 106 are thus arranged to be able to individually form the exposure heads 104a to 104d in the exposure head array 104 shown in FIG. 1A. As another arrangement example, FIG. 5B shows an arrangement in which the height of the LED light sources 106 in the first row reaches the height of those 106 in the second row before they reach the right end. In this case, the individual exposure heads 104a to 104d in the exposure head array 104, shown in FIG. 1A, can execute overlay scanning exposure in the scanning direction. The above array of the LED light sources 106 can be formed by selecting an optimal LED light source device or another arrangement. The design values of optical elements, such as a lens and zone plate, can be appropriately combined in constituting an exposure apparatus, in consideration of various factors such as the light use efficiency, formation condition, mechanical strength, installation accuracy, and cost.

In the preferred embodiment of the present invention, as a sensor for adjusting the interval between the exposure target substrate 102 and exposure head structure 101, a sensor using electromagnetic energy (e.g., a magnetic field, an electrical field, or a radio wave), or a sensor using dynamic energy (e.g., liquid, sound, or position) can be adopted. Such a sensor includes a capacitance sensor for detecting a change in capacitance between a detection target and a sensor, a magnetic proximity sensor using a magnet, an eddy current displacement sensor using a magnet, an eddy current displacement sensor using electromagnetic induction, an ultrasound displacement sensor using ultrasound, and a differential transforming contact type displacement sensor using a differential transformer.

The capacitance sensor is a proximity sensor having a sensitivity which changes depending on a detection target. Assuming the at the permittivity of air is 1, a permittivity detectable by the capacitance sensor is considered to be 1.5 or more. Since the permittivity of a glass substrate is about five to ten, and that of a metal layer formed on the glass substrate is about fifty, the capacitance sensor is suitable for a liquid crystal display exposure apparatus using a glass substrate.

The magnetic proximity sensor is a proximity switch for detecting a change in magnetic flux when a detection target approaches the sensor by combining a magnetic detection element with a magnet.

The eddy current displacement sensor is a proximity sensor using a high-frequency magnetic field. The eddy current displacement sensor supplies a high-frequency current to a coil in a sensor head, to generate a high-frequency magnetic field. When a TFT circuit or a color filter matrix is formed on a glass substrate as an exposure target substrate, a metal film layer is formed on the surface of the glass substrate. In this case, it is possible to employ the eddy current displacement sensor because of the following reason. In the TFT circuit, a gate electrode and wiring portions of the gate and the source are made of metal. In the color filter, a light shielding body for a black matrix is made of a metal such as chromium. When an exposure process is executed after the metal is patterned, the metal shape (pattern) has an influence on the sensor in detecting a gap. Accordingly, if almost the same patterns are formed side by side, the sensors may be arranged at positions corresponding to integer multiples of the pattern pitch, thereby, arranging a plurality of sensors at almost the same positions on the respective patterns. In a liquid crystal display, a plurality of dots (pixels) serving as minimum units for displaying a character or an image are two-dimensionally arranged side by side. Hence, when the plurality of sensors are arranged at positions corresponding to integer multiples of the pixel pitch, while tracing a gate wiring line to cause each sensor to measure a gap, the gaps can be compared and corrected under almost the same condition.

The ultrasound displacement sensor is a proximity sensor which transmits ultrasound from a sensor head and receives ultrasound reflected by an object using the sensor head, thereby measuring a gap.

The differential transforming contact type displacement sensor is a contact sensor which differentially couples an induced current generated in a secondary coil when a primary coil is excited by an alternating current, and extracts the resultant current as a voltage difference to obtain a displacement output. As the sensor according to this embodiment, a noncontact sensor, such as a proximity sensor, is desirable.

However, when the surface of an exposure target substrate coated with a resist is brought into contact with a measurement probe, the depth and width of its trace may be about 10 to 100 nm. Hence, a contact sensor can be used in forming a TFT pattern having a line width of 3 μm.

Figure 6:
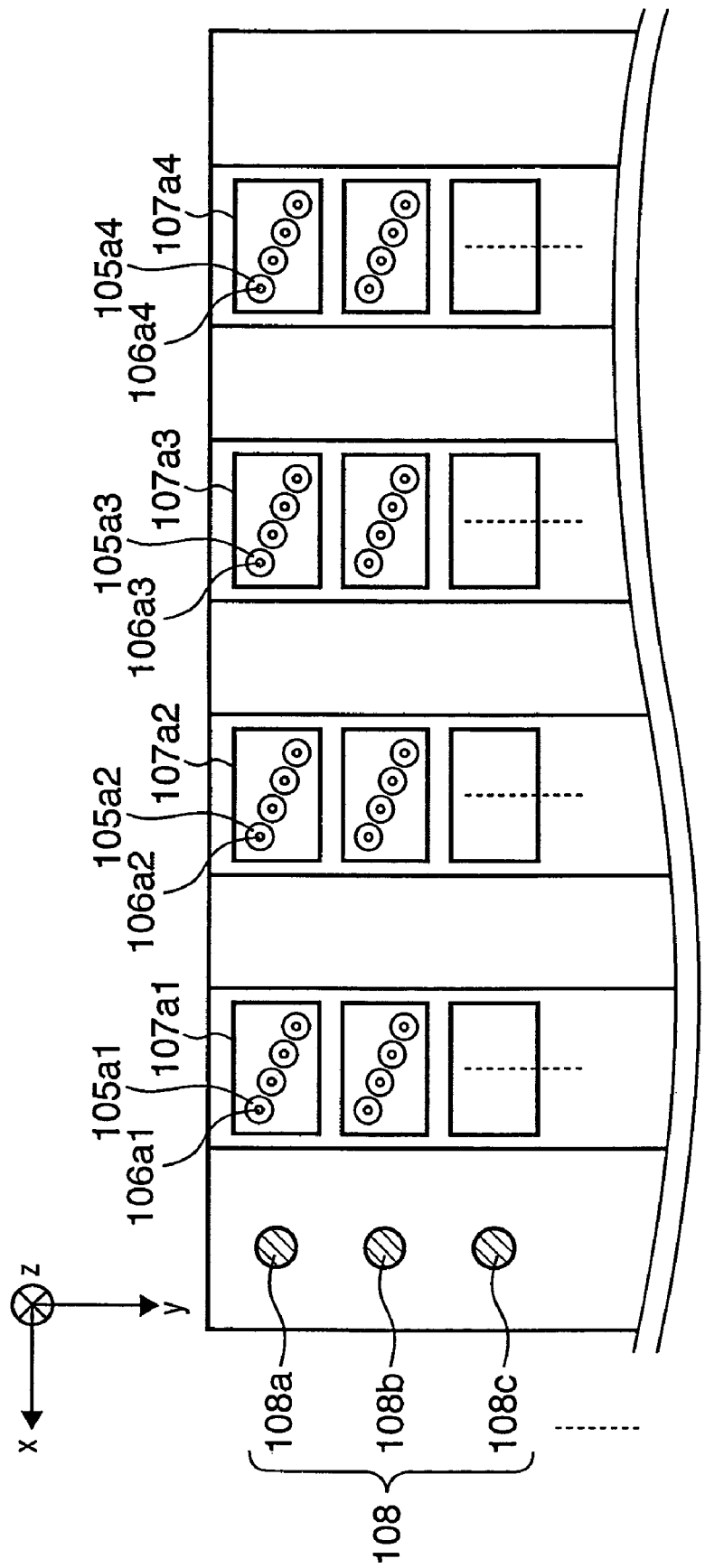
FIG. 6 is a schematic view for explaining the arrangement of sensors of the exposure apparatus according to the first preferred embodiment of the present invention.

As shown in FIG. 3, a sensor 108 of the above type is arranged on the exposure head structure 101 while facing the exposure target substrate 102. FIG. 6 is a view showing the arrangement of the sensor 108 is more detail. The x direction in FIG. 6 corresponds to the scanning direction, and the y direction corresponds to a direction perpendicular to the scanning direction. Sensors 108a, 108b, and 108c are juxtaposed in the y direction. Liquid crystal display pixels $107a_1$, $107a_2$, $107a_3$, and $107a_4$ are juxtaposed in the x direction (scanning direction) in a row corresponding to the sensor 108a.

An optical system $105a_1$ is arranged for the liquid crystal display pixel $107a_1$ in an oblique direction with respect to the x direction. Similarly, an optical system $105a_2$ is arranged for the liquid crystal display pixel $107a_2$ in an oblique direction with respect to the x direction. An optical system $105a_3$ is arranged for the liquid crystal display pixel $107a_3$ in an oblique direction with respect to the x direction. An optical system $105a_4$ is arranged for the liquid crystal display pixel $107a_4$ in an oblique direction with respect to the x direction. LED light sources $106a_1$ to $106a_4$ are arranged at positions corresponding to the respective optical systems $105a_1$ to $105a_4$, in correspondence with the above arrangement. The LED light sources $106a_1$ to $106a_4$ are combined with the corresponding optical systems $105a_1$ to $105a_4$ to form elemental exposure units. Each elemental exposure unit forms an image of the corresponding LED light source on the exposure target substrate 102.

Figure 7:
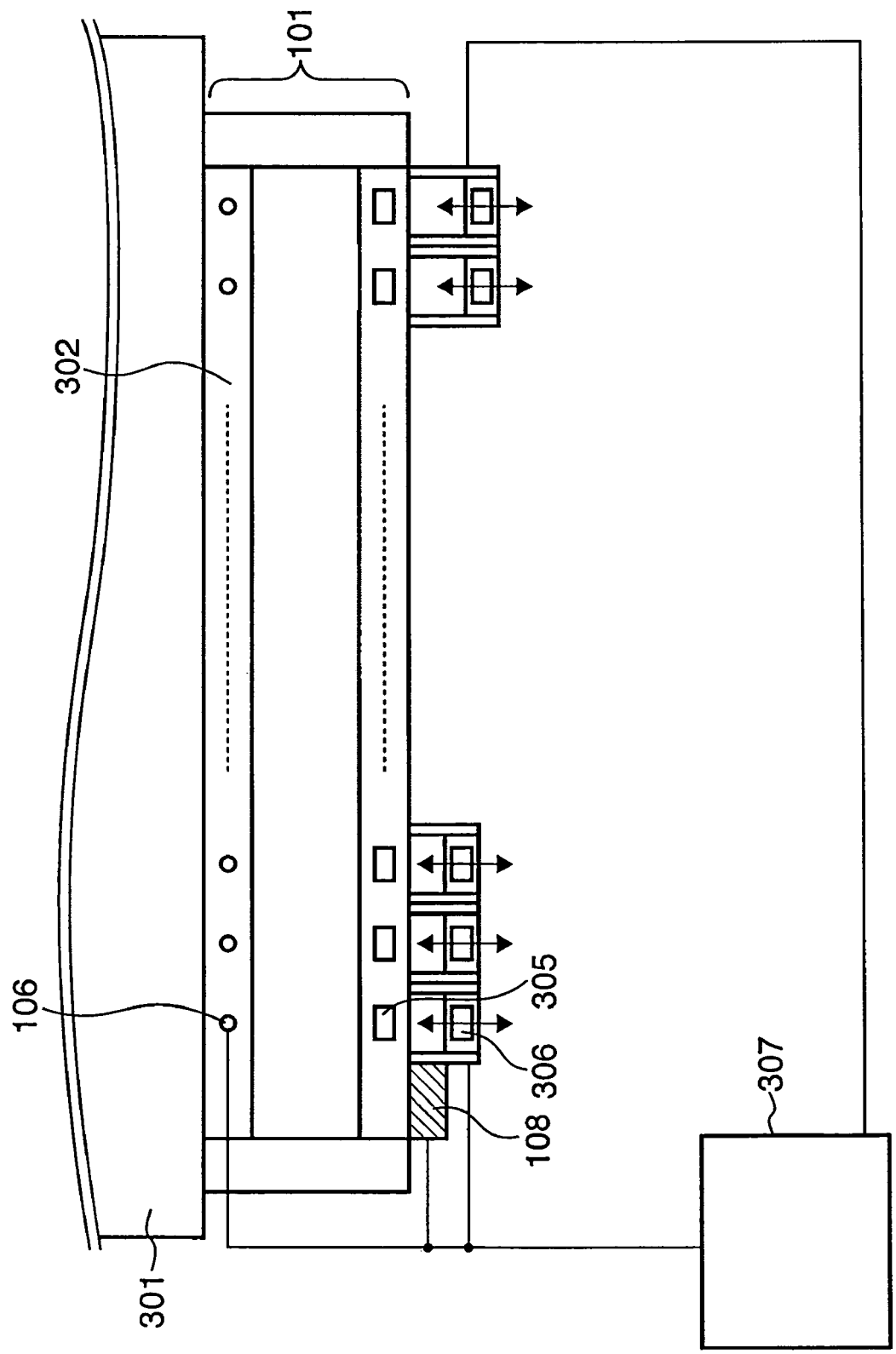
FIG. 7 is a schematic sectional view illustrating an arrangement for adjusting the imaging position of the imaging optical system of the exposure apparatus according to the first preferred embodiment of the present invention.

The sensors 108a, 108b, and 108c can time-serially measure intervals between themselves and the surface of the exposure target substrate 102 in the x direction when the exposure target substrate 102 moves in the x direction. A controller 307 can adjust positions where light source images in the z direction of the optical system $105a_1$ to $105a_4$ are to be formed, based on the detection results by the sensor 108a, 108b, and 108c. As a method of adjusting the positions where the light source images in the z direction of the imaging optical systems $105a_1$ to $105a_4$ are to be formed, it is possible to use a method of adjusting the lens powers of the optical elements (305 and 306 in FIG. 3), which form the imaging optical systems $105a_1$ to $105a_4$, or a method of moving and adjusting the positions of the optical elements 306 in the z direction, as shown in FIG. 7.

Alternatively, the positions where the light source images in the z direction of the optical elements are to be formed may be adjusted in advance, differently from each other, based on the detection results by the sensor 108a, 108b, and 108c, thereby selectively ON/OFF-controlling the LED light sources. For example, referring to FIG. 7, of the imaging optical systems $105a_1$ to $105a_4$, which are arranged in the row corresponding to the sensor 108a, at least one imaging optical system is adjusted in advance to have an imaging position different from the remaining imaging positions. When the interval between the sensor 108a and the surface of the exposure target substrate 102 is time-serially measured in the x direction using the sensor 108a, if the imaging optical system $105a_3$ does not satisfy desired exposure conditions, the controller 307 can selectively turn off the LED light source $106a_3$ corresponding to the imaging optical system $105a_3$ and selectively turn on the LED light sources $106a_1$, $106a_2$, and $106a_4$.

According to this embodiment, the response speed can be increased, and the apparatus arrangement can be simplified using the sensors described above. In addition, when a position, where a light source image of an optical element is to be formed, is adjusted in advance differently from the remaining imaging positions, and an LED light source of an elemental exposure unit, which satisfies desired exposure conditions is selectively operated, the gap adjustment process can be simplified.

Second Embodiment

Figure 8:
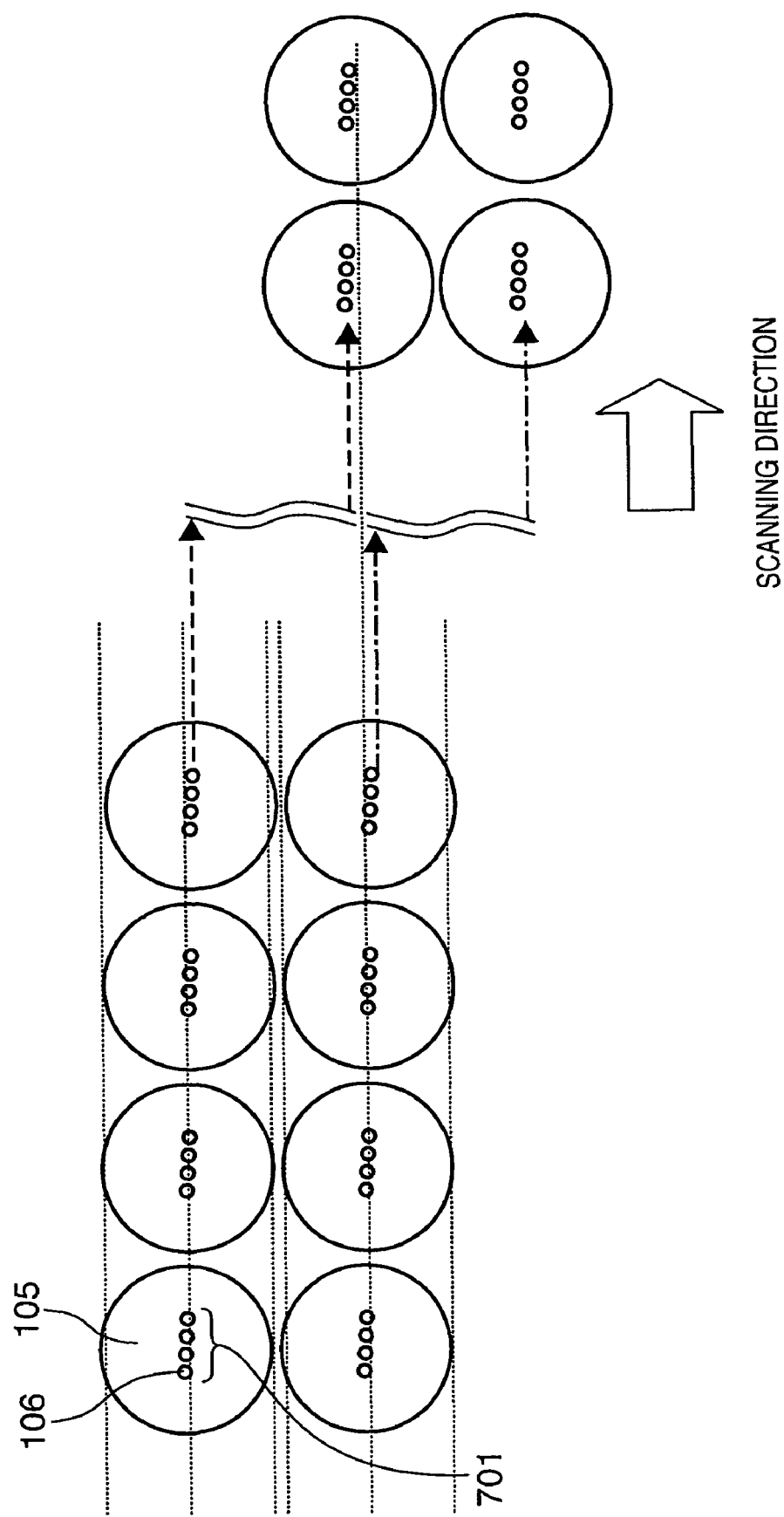
FIG. 8 is a schematic view for explaining scanning exposure, and the array arrangement of light sources and imaging optical systems of an exposure apparatus according to the second preferred embodiment of the present invention.
Figure 9:
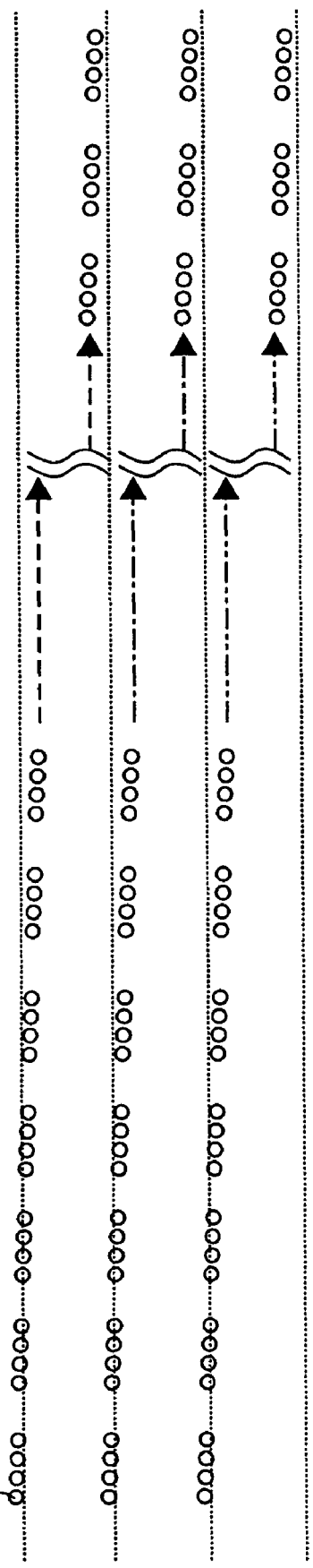
FIG. 9 is a schematic view for explaining scanning exposure, and the array arrangement of the light sources of the exposure apparatus according to the second preferred embodiment of the present invention.

The second preferred embodiment according to the present invention will be explained below with reference to FIGS. 8 to 11. FIG. 8 is a view for explaining scanning exposure of this embodiment, similar to that shown in FIG. 4 and described in the first embodiment. FIG. 8 schematically shows the array arrangement of LED light sources 106 and imaging optical systems 105 when viewed from the top. This embodiment differs from the first embodiment in the arrangement of the LED light sources 106. More specifically, the LED light sources 106 are grouped for each of a plurality of blocks 701, and an image is formed by the imaging optical system 105. That is, FIG. 8 shows an arrangement in which the LED light sources 106 in a row are divided into blocks 701, each having four LED light sources 106, and an image of each group of the LED light sources 106 is formed by a one-to-one imaging optical system or a reduction imaging optical system. FIG. 9 is a view showing light source images of the LED light sources 106 alone. As shown in FIG. 9, the LED light sources 106 in a row are arranged obliquely from the left side to the right side in FIG. 9 (in the scanning direction). The height (position in a direction perpendicular to the scanning direction) of the rightmost LED light source 106 in the first row is almost the same as that of the leftmost light source 106 in the second row.

Although four light sources are included in one block in FIGS. 8 and 9, this embodiment is not limited to this number. For example, one to three or five or more light sources may be grouped. The number of light sources is preferably determined principally based on the aberration of an imaging optical system and the resolution of an exposure pattern. That is, in the imaging optical system, the aberration performance and resolution becomes maximum by forming an image on the optical axis. However, if the distance from the optical axis to the imaging position becomes longer, the aberration performance worsens, resulting in a low resolution.

This embodiment is convenient in that the total number of imaging optical systems can be decreased without decreasing the number of light source images. This amounts to downsizing the exposure heads 104a to 104d in the exposure head array 104 shown in FIG. 1A. Hence, the number of exposure heads 104a to 104d within the same area can be increased, thus improving the exposure throughput.

In the arrangement shown in FIGS. 8 and 9, the block 701 includes a plurality of exposure light sources in only the scanning direction. However, as shown in FIGS. 10 and 11, an elemental exposure unit may be designed to have a block including a plurality of exposure light sources in the scanning direction and a direction perpendicular to the scanning direction. The elemental exposure unit can be appropriately formed in consideration of various factors, such as the entire apparatus size, throughput, the formation condition of an imaging optical system, and cost.

Third Embodiment

Figure 13A:
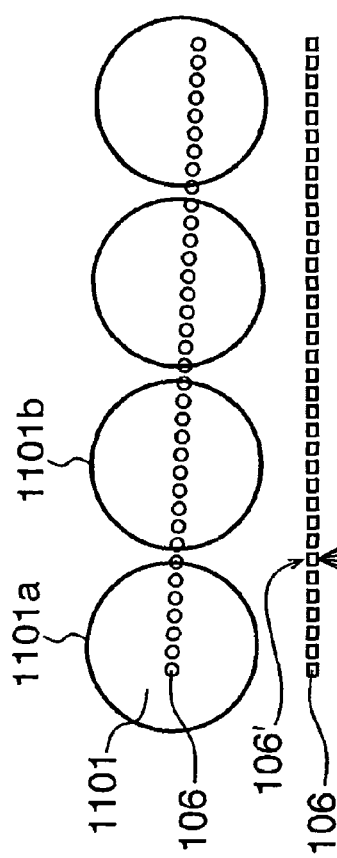
FIGS. 13A and 13B are schematic views for explaining another example of scanning exposure, and the array arrangement of the light sources and imaging optical systems of the exposure apparatus according to the third preferred embodiment of the present invention.

The third embodiment will be explained below with reference to FIGS. 12 to 14. FIG. 12 is a view for explaining scanning exposure according to this embodiment, similar to FIG. 4 described in the first embodiment. FIG. 12 schematically shows the array arrangement of LED light sources 106 and imaging optical systems 1101 when viewed from the top. This embodiment differs from the first embodiment in the arrangement of the LED light source 106. More specifically, the LED light sources 106 are also interposed between the imaging optical system 1001. As shown in FIG. 13, the imaging optical system to be used in this embodiment is a one-to-one erect imaging optical system. As such an optical system, for example, a two-step imaging optical system can be employed to form an intermediate image of the LED light source 106 and to form again the intermediate image on an exposure target substrate 102, as shown in FIG. 13. An optical system on the light source 106 side, which is symmetrical to that on the exposure target substrate 102 side, can be used to implement one-to-one imaging. As a result, for example, light source images of LED light sources 106', which are located at space portions between imaging optical systems 1001a and 1001b arranged in an array, are superimposed on the exposure target substrate 102 by the two imaging optical systems 1001a and 1001b. With this arrangement, the LED light sources 106 may be regularly arranged in a simple array. The array pitch can be set to a short interval. Hence, the number of imaging optical systems with respect to that of light sources can be reduced, thus implementing a compact apparatus. In addition to the realization of a compact exposure apparatus, the exposure throughput can be improved by increasing the number of exposure heads within the same area, while taking advantage of downsizing of one exposure head in the exposure head array 104 shown in FIG. 1A.

Figure 13B:
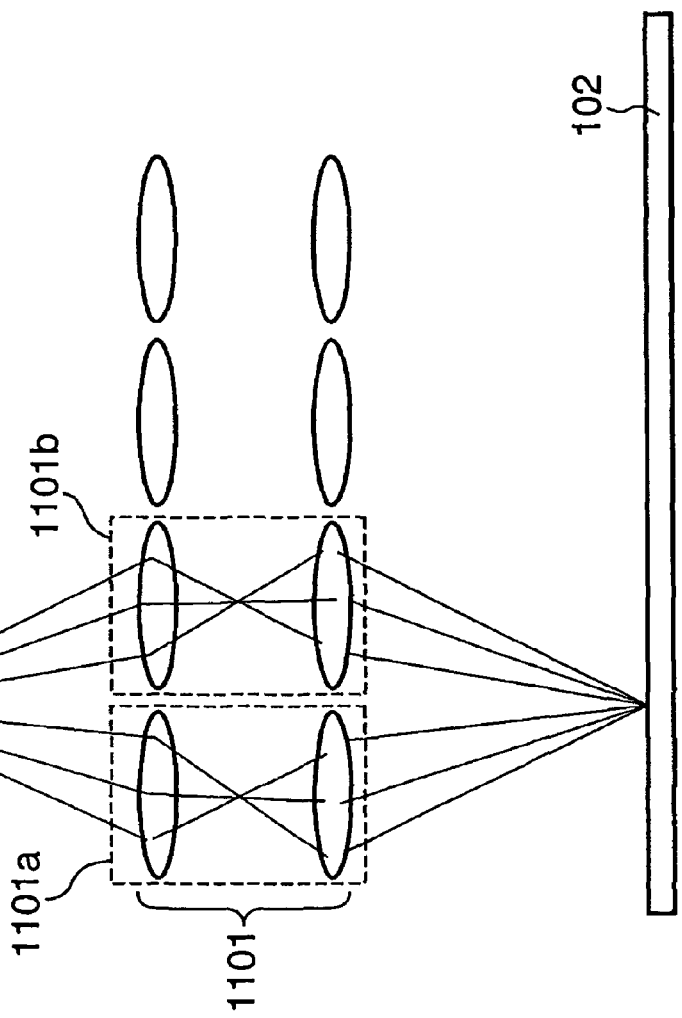

In FIGS. 12 to 13B, the light sources 106 in a row of the scanning direction are continuously arranged in an array without forming a space. However, as shown in FIG. 14, the light sources 106 in a two-dimensional array may be continuously arranged between spaces of projection optical systems. The arrangement of this embodiment can be appropriately selected in consideration of the aberration performance of an imaging optical system and a demand for higher exposure pattern resolution. An image of one light source not only can be simultaneously formed by two projection optical systems, as shown in FIGS. 12 to 13B, but also, can be formed by, e.g., four projection optical systems using an imaging optical system with a higher resolution.

Other Embodiment

The present invention is not limited to the above-described embodiments, and a sequence, and the like, can be variously changed. In addition, as the device arrangements of an LED light source and light source array, the following device arrangements can be appropriately selected and used.

For example, a light source 106 includes a solid-state element which emits light by spontaneous emission. As the solid-state element, a light-emitting diode element (to be referred to as an "LED element" hereafter) or an EL element can be used. As the LED elements, LED elements having various types of light emission wavelengths, e.g., GaAs, GaAlAs, GaP/GaP, GaAlAs,/GaAs, InGaAlP, InGaAlP/GaP, InGaAlP/GaAs, AlInGaN, AlGaN, InGaN, GaN, AlN, ZnO, ZnSe, or diamond can be used. It is more preferable to use LED elements having light emission wavelengths suitable to expose a resist, e.g., AlInGaN, AlGaN, or InGaN, although the present invention is not particularly limited to this. As the EL element, organic EL and inorganic EL can be used.

The light emission wavelength of an LED element is desirably set in accordance with the sensitivity of a resist as the exposure target. An LED element having an emission wavelength with a central wavelength of 365 nm and a spectral half width $\Delta\lambda$ of about 10 nm to about 20 nm can be used. When selecting the emission wavelength of the LED element, an LED element, which has an optimal emission wavelength and wavelength width, may be selected in accordance with the sensitivity curve of the resist, regardless of the type of the resist. Furthermore, in the arrangement using the overlay exposure process described above, a plurality of LED elements having different light emission wavelengths may be mixed, to exhibit a desired exposure wavelength distribution on the irradiated surface.

In the above-described embodiments, light from an LED is directly used for exposure. That is, no wavelength filter is necessary to select a specific wavelength range. Actually, a wavelength filter may be used when necessary. The wavelength filter may be monolithically formed with each LED element. Resonator LEDs as disclosed in (Science, Vol. 265, page 943, 1994) may be used.

Since an LED light source can typically take a modulation frequency up to the GHz order, at maximum, by removing/transporting a substrate in a 10-MHz GaN system, it can be turned on/off at a very high speed. Using this feature, a high output can be obtained by performing an exposure operation, which may be originally an ON operation performed once, by finer-pulse driving to perform pulse emission. This is because the LED element radiates heat efficiently using the pulse driving process, so that a larger average current and average power can be supplied to the LED light source. When the repeating frequency is sufficiently high as compared to the exposure time of the exposure apparatus, the resist can be exposed in the same manner as with continuous light. The exposure amount can be adjusted depending on the pulse number.

To improve the use efficiency of light emitted by an LED, an LED element having a light convergence distribution can be used. As the LED element having the light convergence distribution, for example, an LED element which controls the space mode of light emitted from the LED element by spontaneous emission may be used to change the distribution of the spontaneous emission light. More specifically, the space mode of the emitted light may be directly controlled by an LED integral with a resonator, in accordance with spontaneous emission control, or the like, which uses a resonator QED effect described in the article mentioned above, to change the distribution of the spontaneous emission light.

As the LED array light source, an LED array light source, which is formed as a light source with a wafer scale, may be used. An optimal number of LED arrays included in one chip for an LED light source can be selected in consideration of the device yield and mounting cost.

Figure 15:
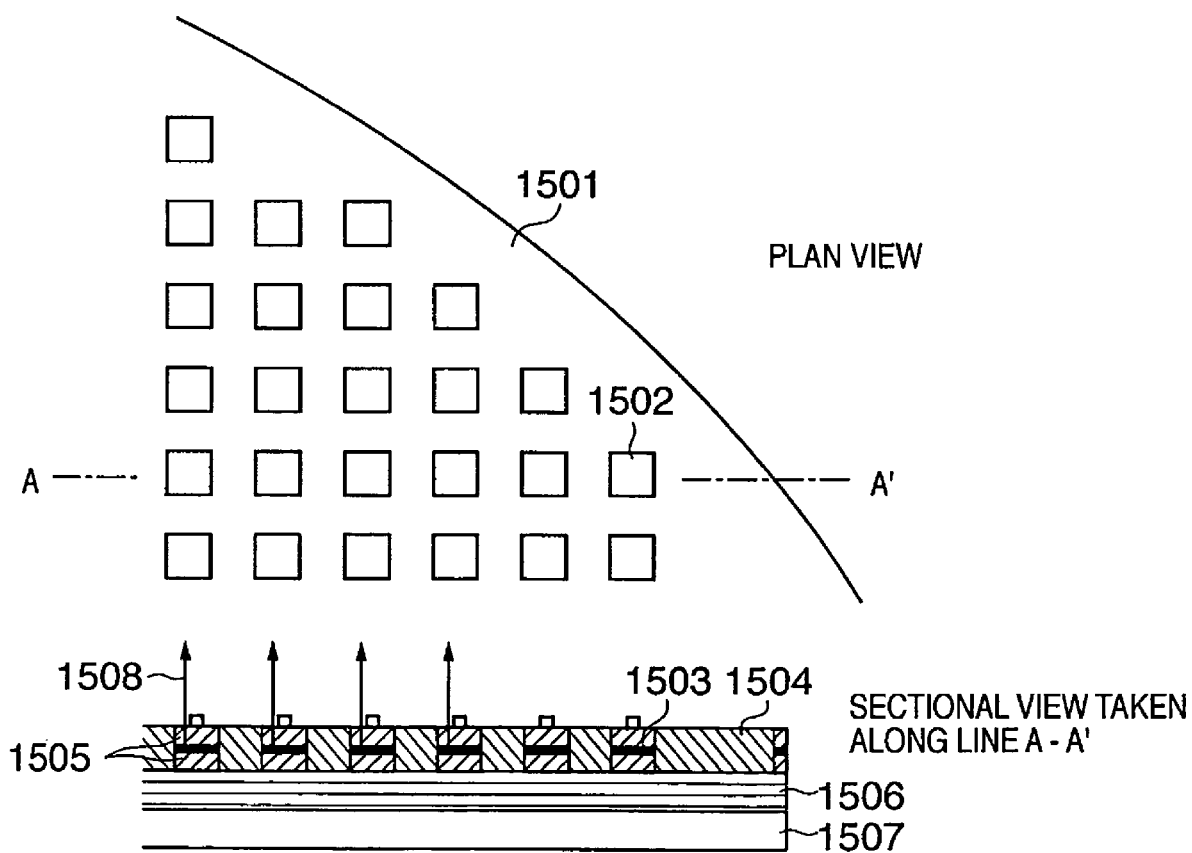
FIG. 15 shows schematic views of an example of the device arrangement of an LED light source array of an exposure apparatus according to the present invention.

FIG. 15 shows schematic views of an example of the arrangement of the LED surface light source. FIG. 15 also shows a light source formed with a wafer scale. As shown in the plan view in the upper view of FIG. 15, respective LED elements are formed on LED light-emitting portions 1502 on one LED surface light source wafer 1501 by a predetermined device process. The lower view of FIG. 15 is a sectional view taken along the line A-A' in the plan view of FIG. 15. A driving circuit layer 1506 for driving LED elements is formed on a substrate 1507, and the LED elements are formed on the driving circuit layer 1506. Each LED element includes an LED active layer 1503 having a pn junction, an isolation/current constriction structure 1504, an independent-driving electrode 1505, and a driving IC circuit layer 1506.

Figure 16:
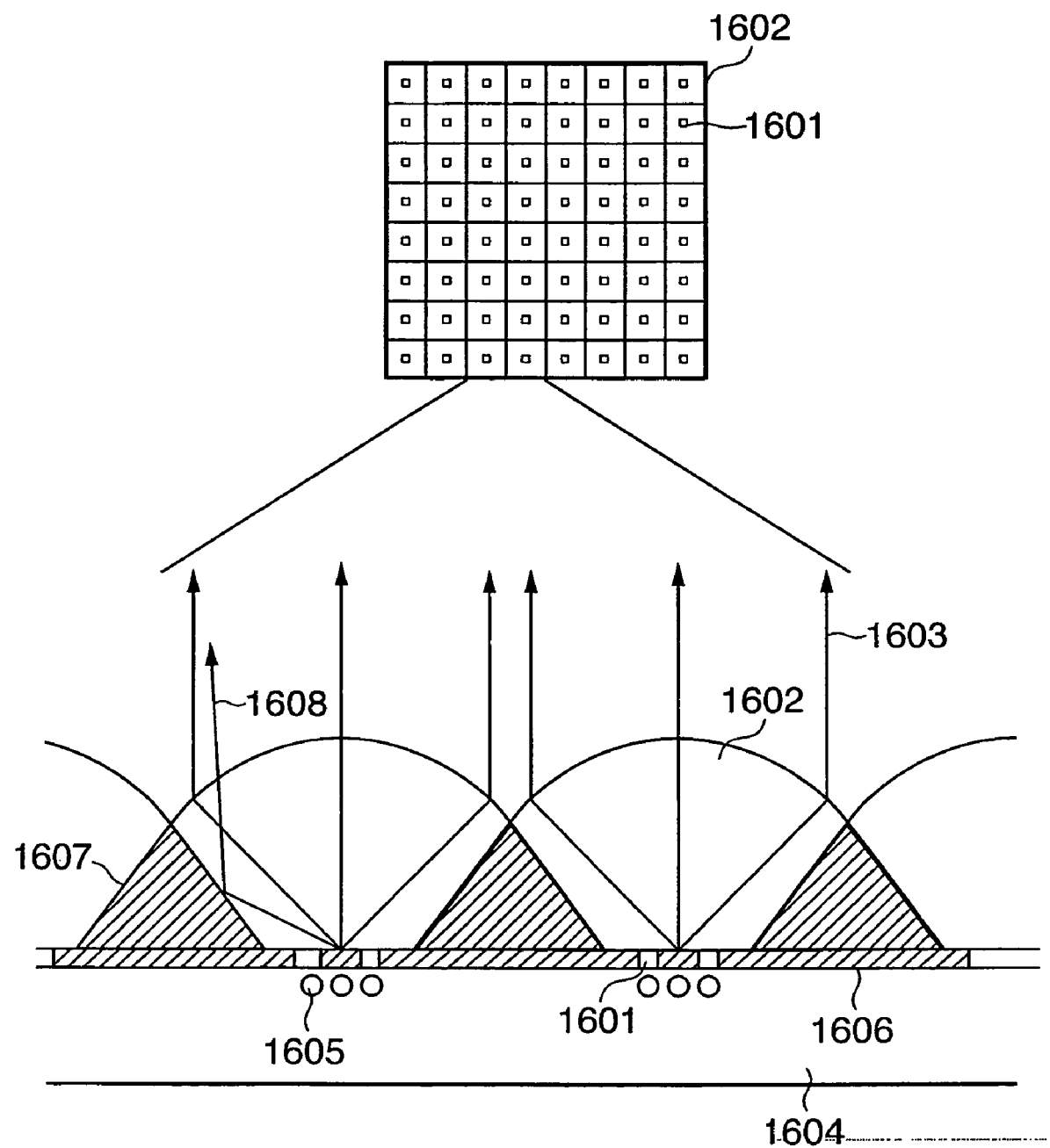
FIG. 16 is a schematic view showing an example of an arrangement in which the LED light source array and part of an imaging optical system of the exposure apparatus according to the present invention are integrated.

FIG. 16 shows an arrangement in which LED light sources 1601 are integrated with planoconvex lenses as part of an imaging optical system. FIG. 16 also shows an arrangement including a cooling unit that cools the LED elements 1601. The cooling unit desirably includes a substrate 1604 serving as a supporting unit that supports the LED elements 1601 to cool the substrate 1604, and then, the LED elements 1601. In this case, as the substrate 1604, on which the LED elements 1601 are to be mounted, a metal plate (e.g., a substrate made of an alloy of copper and tungsten, or the like) having good heat radiation performance can be used. The metal plate is desirably arranged on the opposite sides to the light emission surfaces of the LED elements 1601. A cooling device, which cools the substrate 1604 directly, may be arranged on the substrate 1604. The substrate 1604 is not limited to the metal plate. For example, when necessary, a semiconductor substrate (e.g., a silicon substrate), a diamond substrate, or a graphite substrate may be used, considering its heat emission performance and, e.g., workability.

As shown in FIG. 16, a cooling channel 1605, through which a fluid for cooling the LED elements 1601 flows, may be formed in the substrate 1604. In this case, as water cooling is performed at positions close to the LED elements 1601, the cooling effect is enhanced. A cooled fluid is supplied to the cooling channel 1605 from a pipe, or the like (not shown). As the fluid, for example, a cooling solution (e.g., water, pure water, or ultra pure water) and/or a cooling gas (e.g., an inert gas, such as Ar, or a gas, such as $N_2$) can be used.

To fill the gaps between the substrate 1604 and lenses 1602, spacers 1606 may be arranged between them. To reflect wide-angle exit light 1608 from the LED elements 1601 in the direction of the optical axis, the substrate 1604 side portions of the lenses 1602 may be cut out in quadrangular prisms and ridge structures 1607 may be arranged along the resultant space. Aluminum films may be formed on the interfaces between the lenses 1602 and ridge structures 1607 so that the interfaces have high reflectance. The ridge structures 1607 may be hollow. In this case, the inclined interfaces serve as reflection surfaces of total reflection or Fresnel reflection, in accordance with a difference in refractive index between the lenses 1602 and air. High-reflectance metal films of aluminum, rhodium, silver, or the like, may be formed in advance on the inclined surfaces of the lenses 1602.

Application Example

Figure 17:
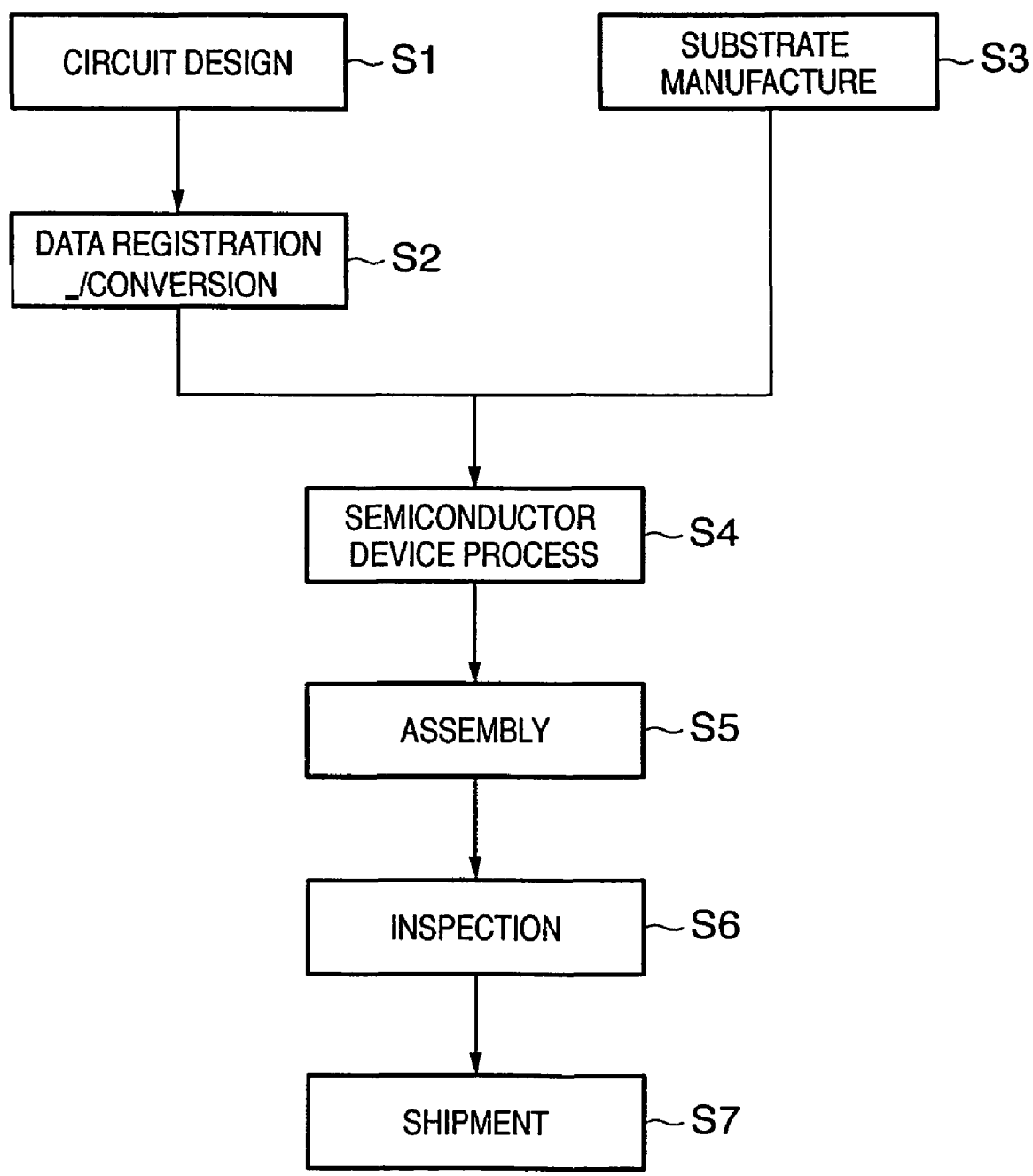
FIG. 17 is a flowchart showing a device manufacturing method according to the present invention.

A semiconductor device manufacturing process using an exposure apparatus according to a preferred embodiment of the present invention will be explained below. FIG. 17 is a flowchart showing the flow of the overall process of manufacturing a semiconductor device. In step 1 (circuit design), a semiconductor device circuit is designed. In step 2 (mask fabrication), the designed circuit pattern is registered in the exposure apparatus to convert the pattern data into exposure light source array ON/OFF data. In step 3 (substrate manufacture), an exposure target substrate is manufactured using a material, such as glass or a semiconductor. In step 4 (semiconductor device process), called a preprocess, an actual circuit is formed on the substrate by the exposure apparatus described above in accordance with lithography, using the pattern exposure target and exposure target substrate described above. In step 5 (assembly), called a post-process, a device panel is formed using the circuit substrate fabricated in step 4. This step includes assembly processes, such as assembly and packaging. In step 6 (inspection), inspections, such as an operation check test and a durability test, of the semiconductor device and device panel fabricated in step 5 are performed. A device panel is thus finished with these steps, and shipped, in step 7.

The semiconductor device process in step 4 includes an oxidation step of oxidizing the surface of the semiconductor layer, a CVD step of forming an insulating film on the surface, an electrode formation step of forming an electrode on the surface by vapor deposition, an ion implantation step of implanting ions in the semiconductor layer, a resist processing step of applying a photosensitive agent to the substrate, an exposure step of causing the above-mentioned exposure apparatus to form a circuit pattern on the substrate having undergone the resist processing step, a development step of developing the substrate exposed in the exposure step, an etching step of etching the resist except for the resist image developed in the development step, and a resist removal step of removing any unnecessary etched resist. These steps are repeated to form multiple circuit patterns on the substrate.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus which forms a pattern on an object, said apparatus comprising:
    an exposure head structure in which a plurality of elemental exposure units are arrayed, each elemental exposure unit including (i) at least one light source for emitting exposure light and (ii) an optical element which forms an image of the at least one light source on the object, for exposing the object;
    a sensor which detects a position of a surface of the object in a direction perpendicular to the surface and which produces a detection result; and
    a controller which receives the detection result from said sensor and controls said exposure head structure such that a pattern is formed on the object by the exposure, while at least one of said plurality of elemental exposure units, which can form the image while satisfying a given exposure condition, is selected to expose the object, based on the detection result by said sensor,
    wherein said plurality of elemental exposure units are adjusted before exposure of the object, such that positions of the images, formed by the at least one light source of said plurality of elemental exposure units, vary in the direction perpendicular to the surface of the object to include plural positions different from each other.

2. The apparatus according to claim 1, wherein said optical element forms the image of the at least one light source on the object at a predetermined magnification.

3. The apparatus according to claim 2, wherein the magnification is an equal magnification or a reduction magnification.

4. The apparatus according to claim 1, further comprising a cooling unit that cools the at least one light source.

5. The apparatus according to claim 1, wherein said controller pulse-drives the at least one light source to emit temporally discrete pulse light.

6. The apparatus according to claim 1, wherein the at least one light source includes a light-emitting diode element.

7. The apparatus according to claim 1, wherein the at least one light source includes an electroluminescent (EL) element.

8. The apparatus according to claim 1, wherein the at least one light source contained in each elemental exposure unit is grouped into a row, a distance between each sequential light source in each elemental exposure unit is constant, and a distance between the last light source in the row in one elemental exposure unit and the first light source in the row in the sequentially next elemental exposure unit is greater than a distance between each sequential light source unit in the row in each elemental exposure unit.

9. The apparatus according to claim 1, wherein the images of the at least one light source are formed on the object using said optical element.

10. The apparatus according to claim 1, wherein the at least one light source includes a plurality of types of light sources respectively having different light emission wavelengths.

11. A method of manufacturing a device, said method comprising steps of:
forming a pattern on a substrate using an exposure apparatus defined in claim and
developing the substrate having the pattern formed thereon, to manufacture a device.

12. An exposure apparatus which forms a pattern on a surface of a substrate, said apparatus comprising:
a substrate stage for supporting the substrate;
an exposure head structure, disposed opposite to the substrate stage, in which a plurality of elemental exposure units for exposing the substrate are arrayed, each elemental exposure unit including (i) at least one light source for emitting exposure light and (ii) an optical element which forms an image of the at least one light source on a surface of the substrate;
at least one sensor which detects a position of the surface of the substrate in a direction perpendicular to the surface of the substrate and which produces a detection result; and
a controller which receives the detection result from said at least one sensor and controls at least one of said plurality of elemental exposure units of said exposure head structure to form a pattern on the substrate by adjusting said exposure head structure, before exposure of the substrate, such that positions of the images formed by said plurality of elemental exposure units vary in the direction perpendicular to the surface of the substrate to include plural positions different from each other.

13. The apparatus according to claim 12, wherein an interval between the surface of the substrate and the exposure head structure is adjusted based on the detection result.

14. The apparatus according to claim 12, further comprising a plurality of sensors to detect the position of the surface of the substrate, wherein the substrate moves while being scanned and said plurality of sensors are arranged in a direction perpendicular to a direction in which the substrate moves.

* * * * *